US012174418B2

(12) United States Patent
Karabchevsky (10) Patent No.: US 12,174,418 B2
(45) Date of Patent: Dec. 24, 2024

(54) STRUCTURE FOR A WAVEGUIDE FACET (71) Applicant: B.G. Negev Technologies and Applications LTD., at Ben-Guiron University, Beer Sheva (IL)

(72) Inventor: Alina Karabchevsky, Lehavim (IL)

(73) Assignee: B.G. Negev Technologies and Applications LTD., at Ben-Gurion University, Beer Sheva (IL)

( * ) Notice: Subject to any disclaimer, the term of this patent is extended or adjusted under 35 U.S.C. 154(b) by 240 days.

(21) Appl. No.: 17/792,376

(22) PCT Filed: Jan. 19, 2021

(86) PCT No.: PCT/IL2021/050053
§ 371 (c)(1),
(2) Date: Jul. 12, 2022

(87) PCT Pub. No.: WO2021/149043
PCT Pub. Date: Jul. 29, 2021

(65) Prior Publication Data
US 2023/0034350 A1 Feb. 2, 2023

Related U.S. Application Data

(60) Provisional application No. 62/963,200, filed on Jan. 20, 2020.

(51) Int. Cl.
*G02B 6/122* (2006.01)
*G02B 1/00* (2006.01)
(Continued)

(52) U.S. Cl.
CPC .............. *G02B 6/122* (2013.01); *G02B 1/002* (2013.01); *G02B 1/118* (2013.01); *G02B 6/4207* (2013.01)

(58) Field of Classification Search
CPC ...... G02B 6/122; G02B 6/4207; G02B 1/002; G02B 1/118; H01L 33/22; H01L 33/58
See application file for complete search history.

(56) References Cited

U.S. PATENT DOCUMENTS

2003/0223692 A1 12/2003 Ikarashi et al.
2011/0033156 A1* 2/2011 Sanghera ......... B29D 11/00682
264/2.7
(Continued)

FOREIGN PATENT DOCUMENTS

WO 2020157741 A1 8/2020

OTHER PUBLICATIONS

Karabchevsky, Alina, et al., Broadband transparency with all-dielectric metasurfaces engraved on silicon waveguide facets: effects of inverted and extruded features based on Babinet's principle Nanoscale Advances 2.7, pp. 2977-2985, Jun. 3, 2020. (9 pages).
(Continued)

*Primary Examiner* — Michael P Mooney
(74) *Attorney, Agent, or Firm* — Laura M. King; Matrix Law Group, LLP (57) ABSTRACT

The invention relates to an on-chip optical waveguide comprising an input or output facet, the facet comprising an array of unit-cells; each unit cell is a recess that gradually narrows in the direction from the outer of the waveguide towards the interior of the waveguide.

7 Claims, 5 Drawing Sheets

(51) Int. Cl.
*G02B 1/118* (2015.01)
*G02B 6/42* (2006.01)

(56) References Cited

U.S. PATENT DOCUMENTS

| | | |
|---|---|---|
| 2012/0146044 A1 | 6/2012 | Gmeinwieser et al. |
| 2013/0083402 A1* | 4/2013 | Sanghera .............. G02B 6/255 |
| | | 359/601 |
| 2015/0097210 A1* | 4/2015 | Krasulick ............. H01S 5/3013 |
| | | 257/184 |

OTHER PUBLICATIONS

EPO, Supplementary European Search Report issued in related European Patent Application No. EP21744428.0 on Sep. 11, 2023, 7 pages.

* cited by examiner

Fig. 1
Prior Art

Fig. 2a
Prior Art
PCT/IL2019/051425

Fig. 2b
Prior Art
PCT/IL2019/051425

STRUCTURE FOR A WAVEGUIDE FACET

CROSS-REFERENCE TO RELATED APPLICATIONS

The present Application is a national stage of International Patent Application No. PCT/IL2021/050053, titled "Structure For A Waveguide Facet," filed Jan. 18, 2021, which claims the benefit of U.S. Provisional Patent Application No. 62/963,200, titled "Structure For A Waveguide Facet," filed Jan. 20, 2020, the contents of which are incorporated herein by reference in their entirety.

FIELD OF THE INVENTION

The invention relates in general to the field of optical components. More specifically, the invention relates to the field of optical waveguides.

BACKGROUND OF THE INVENTION

Passive optical waveguides are widely used for transferring optical signals between two physical locations. One type of optical waveguide is the on-chip waveguide. A single semiconductor chip having an area of several $cm^2$ (or even less) can contain up to several hundreds of optical waveguides. Such chips are typically used in cameras, telescopes, multiplexers, devices that include on-chip laser, filters, light sources, amplifiers, and other optical devices. An optical waveguide embedded within a semiconductor chip is limited in its structure to those materials that are commonly used in the semiconductor industry. For example, materials such as silicon, silicon-Nitride, Gallium Arsenide, etc., that are substantially transparent in a relevant light spectrum are commonly used in the semiconductor industry to make the core of on-chip waveguides. Using such materials at the core of the waveguide allows applying waveguide capabilities such as switching, multiplexing, division, mode conversion, etc.

Optical transparency is an essential property of a waveguide. It is a measure of the power transmitted through the waveguide compared to the input power. The transmission efficiency is highly affected by propagation losses, coupling efficiency, but most importantly, by Fresnel reflections from the input and output facets. These reflections are particularly significant when the waveguide is made of a high-index material, such as silicon, germanium, silicon nitride, or other materials commonly used for photonic integrated circuitry. While all these materials have a refractive index higher than the refractive index (1.0) of air (which is an essential requirement to allow signal transfer through the waveguide), their refractive index is still significantly higher than the refractive index of air. As a result of the high refractive index at the commonly used semiconductor core materials, such on-chip waveguides suffer from a drawback of very low efficiency of light transfer. The refractive index of about 4.0 of silicon and gallium-arsenide, and about 2.0 of silicon-nitride, causes about 35% loss of optical signal energy at the inward transition from the air medium to the core material of the waveguide, given Fresnel reflections. For similar reasons, the signal loses an additional 35% of its energy at the outward transition from the waveguide's core to the air. In total, while passing through the waveguide, the optical signal loses about 51% of its energy just due to these air-core-air material transitions. Such losses are very significant and, of course, associated with the natural properties of the waveguide's materials. It should be noted that the above efficiency problem is typical only to on-chip waveguides, given the core materials that are typically used. Conventional optical waveguides (i.e., those not designed for on-chip use), such as passive fiber-optics that typically use silica glass at their core, lose only about 4% of the signal energy due to transition from the air to the fiber-optic glass-core (or vice versa). Therefore, this efficiency problem is much less significant in fiber-optics or waveguides using silica at their core.

One typical prior art solution to the abovementioned efficiency problem suggests applying a coating material (aluminum, aluminum-oxide, barium-fluoride, calcium-fluoride, Cerium (IV) oxide, etc.) at the input and output facets of the optical element. Such an approach typically reduces reflections in a specific spectrum. However, it is substantially impossible to apply a coating to such tiny-polished surfaces of on-chip waveguide facets to avoid high reflection. The coating, even if somehow successfully applied to a waveguide facet, seems problematic for still another reason: coating, in general, tends to separate from the coated material, and this separation, when it occurs, significantly damages the performance of the component. This situation is particularly noticeable in high-acceleration environments, high temperature, high-pressure, or environmental stress variations, such as in airplanes, satellites, high-power devices, and space stations. Moreover, typical prior art on-chip waveguides are narrow-band components capable of operating in a specific light spectrum (for example, near-infrared).

Therefore, another facet structure is desired for on-chip waveguides.

Co-pending PCT/IL2019/051425, by the same applicant and inventor, discloses a waveguide facet for an on-chip optical waveguide. The facet includes a grid of protruding unit-cells that are gradually expanding when viewed in the direction from the outer of the waveguide towards the waveguide's interior. For example, the unit-cells can be selected from a group comprising cones or pyramids or a combination thereof. In one embodiment of PCT/IL2019/051425, the unit cells are truncated cones, hemispherical cones, or parabolic cones. The unit cells may be arranged on the facet in a staggered grid form or a linear grid form. The gradually expanding unit cells of PCT/IL2019/051425 are engraved on the facet, for example, by employing a FIB machine.

PCT/IL2019/051425 has demonstrated a transmission efficiency of about 95% compared to an efficiency of about 51% in prior art waveguides.

While the facet of PCT/IL2019/051425 is superior in terms of light reflection (and therefore transmit efficiency through the waveguide) over prior art waveguide facets, the fabrication of such a facet on a mass scale is relatively complicated, mainly due to the small dimensions of each of its protruding unit-cells (in the micrometer or nanometer scale). Therefore, another solution is desired.

It is an object of the invention to provide a facet structure for an on-chip waveguide, which significantly reduces the level of reflection of the incoming light compared to prior art facets.

Another object of the invention is to provide said waveguide's facet structure, which reduces reflections in a broad-band spectrum.

It is another object of the invention to provide a facet structure for an on-chip waveguide, which is compatible with conventional waveguide's core materials used in the microelectronics industry.

It is still another object of the invention to provide a facet structure with all the above advantages and whose fabrication is simpler than the fabrication of the prior art facet of PCT/IL2019/051425.

Other objects and advantages of the invention will become apparent as the description proceeds.

SUMMARY OF THE INVENTION

The invention relates to an on-chip optical waveguide comprising an input or output facet, the facet comprising an array of unit-cells; each unit cell is a recess that gradually narrows in the direction from the outer of the waveguide towards the interior of the waveguide.

In an embodiment of the invention, the gradually narrowing unit-cell recesses are selected from a group comprising hollow cones or hollow pyramids.

In an embodiment of the invention, the gradually narrowing unit cell recesses are hollow cones, hollow pyramids, or a combination thereof.

In an embodiment of the invention, the gradually narrowing unit-cell recesses are selected from the group comprising hollowed truncated cones, hollowed hemispherical cones, and hollowed parabolic cones.

In an embodiment of the invention, the unit-cell recesses are arranged on the facet in a staggered form.

In an embodiment of the invention, the unit-cells are arranged on the facet in a linear-array form.

In an embodiment of the invention, each unit-cell has sub-wavelength dimensions.

In an embodiment of the invention, each unit-cell has a diameter between 460 nm and 580 nm and a depth between 800 nm and 950 nm.

DETAILED DESCRIPTION OF PREFERRED EMBODIMENTS

Figure 1:
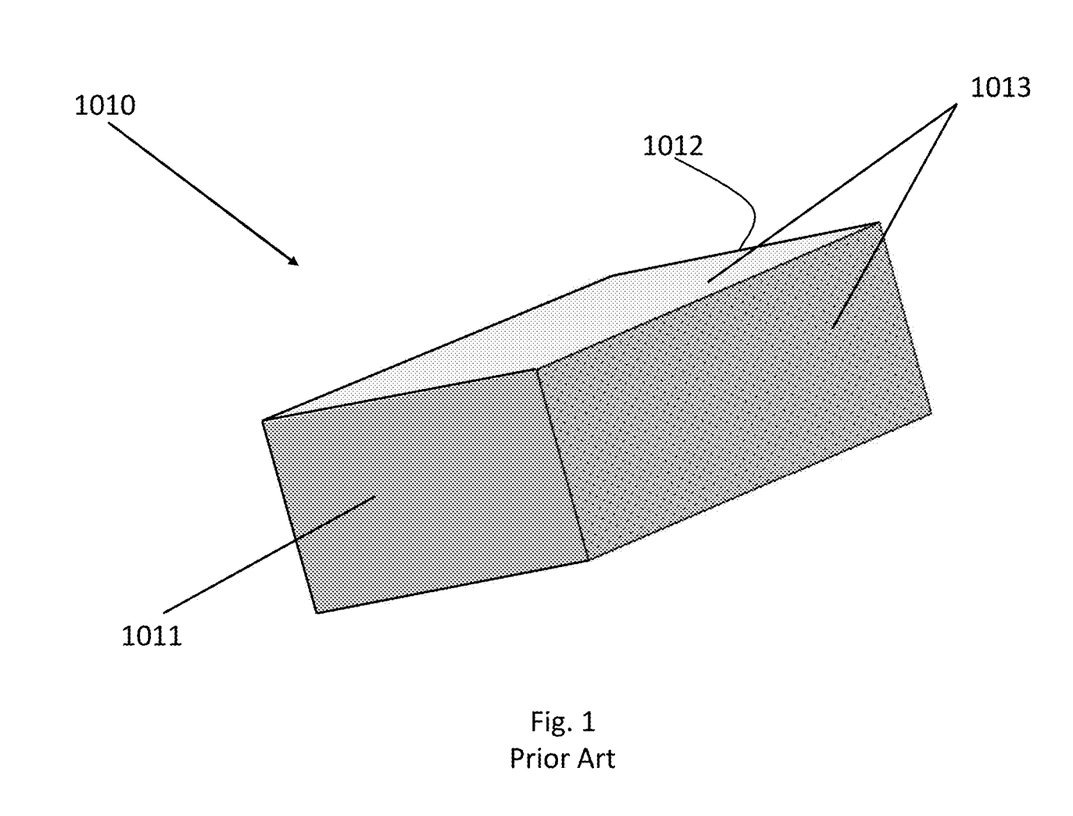
FIG. 1 shows a typical prior art on-chip optical waveguide.

A typical prior art on-chip optical waveguide 1010 is shown in FIG. 1. The waveguide has a cuboid shape with an input facet 1011, an output facet 1012, and a plurality of side facets 1013. The waveguide's core is typically made of a material having a relatively high refractive index, such as silicon, silicon-nitride, gallium-arsenide, etc. The side facets 1013 are typically coated by an outer cladding layer, a material with a lower refractive index than the core. As shown, the input facet 1011 and similarly the output facet 1012 (not seen) are smoothly polished. As a result of the relatively high refractive index of the core material, the waveguide transfer efficiency is relatively low, mainly due to losses in the air-core interface at the input facet 1011 and due to core-air interface losses at the output facet 1012. The total of said losses is typically about 65% when a silicon core is used.

Figure 2A:
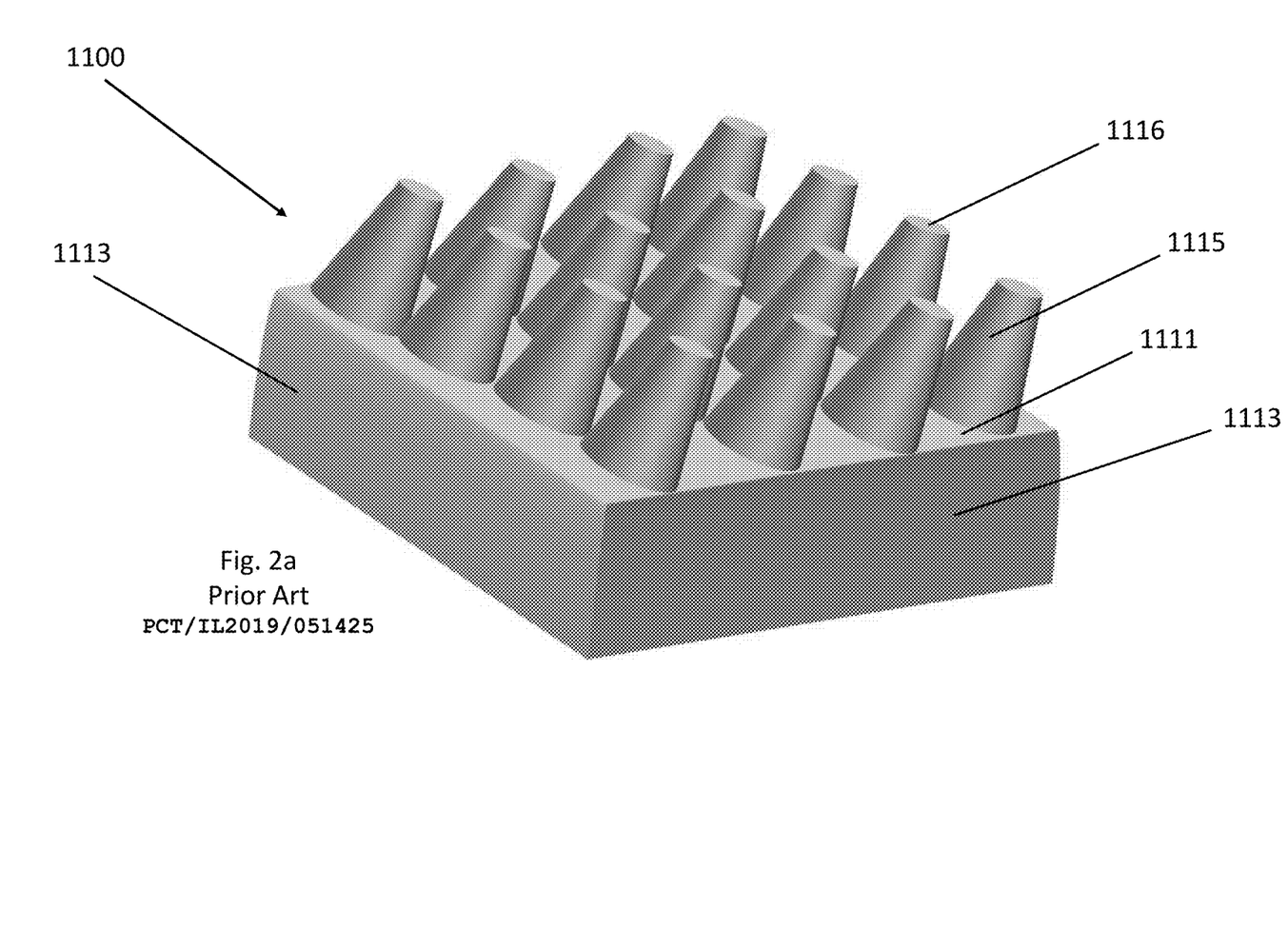
FIG. 2a shows an on-chip waveguide, according to an embodiment of PCT/IL2019/051425.

The inventors of PCT/IL2019/051425 have realized that shaping the input (and optionally also the output) facet of the waveguide in a form of a grid of protruding and "gradually expanding elements" significantly improves the efficiency of the optical transmission through the waveguide. The term "gradually expanding elements" refers to elements such as cones, pyramids, etc. The elements of PCT/IL2019/051425 (also referred to hereinafter as "unit cells") were arranged on the facets so that they expand when viewed in the direction from the air medium to the waveguide's core. PCT/IL2019/051425 has shown that various gradually expanding shapes can be used, such as truncated, parabolic, hemispherical, etc. (at their tips or sidewalls). FIG. 2a shows an on-chip waveguide 1100, according to an embodiment of PCT/IL2019/051425, in which each of the gradually expanding elements 1115 has a shape of a truncated cone. In similarity to the prior art waveguide of FIG. 1, the core of the waveguide 1100 is made of a material having a relatively high refractive index, such as silicon, silicon-nitride, gallium-arsenide, etc. The side-facets 1113 of the waveguide of PCT/IL2019/051425 are typically coated by an outer cladding layer, a material with a lower refractive index than the refractive index of the core. The input facet 1111 of the on-chip waveguide of PCT/IL2019/051425 is structured to include a grid of gradually expanding elements (in this case, truncated cones) 1115—this is in contrast to the prior art waveguide 1010 of FIG. 1 in which the input and output facets, 1011 and 1012 respectively, are smooth. The output facet of the waveguide of PCT/IL2019/051425 can be made the same as the input facet of the waveguide 1100 of FIG. 2a. It was shown in PCT/IL2019/051425 that this facet's structure significantly improves transmission efficiency through the waveguide, compared to the prior art waveguide 1010 of FIG. 1, having smooth input and output facets 1011 and 1012, respectively. Furthermore, the transmission band of the waveguide 1100 of the waveguide of PCT/IL2019/051425 is significantly broader compared to other prior art optical waveguides. While in the other prior art waveguides, the incoming beam's wave-front interaction with the facet is simultaneous over the entire facet's area, in facet 1100 of PCT/IL2019/051425, having a grid of gradually expanding elements 1115, the interaction of the wave-front is gradual over the area of the facet. It was shown in PCT/IL2019/051425 that increasing the density (i.e., the fill factor) of the gradually expanding elements over the facet's area improves the waveguide's efficiency transmission. Therefore, the inclusion of as many as possible protruding and gradually expanding elements in the facet (i.e., having a grid that is as dense as possible) increases the efficiency.

Figure 2B:
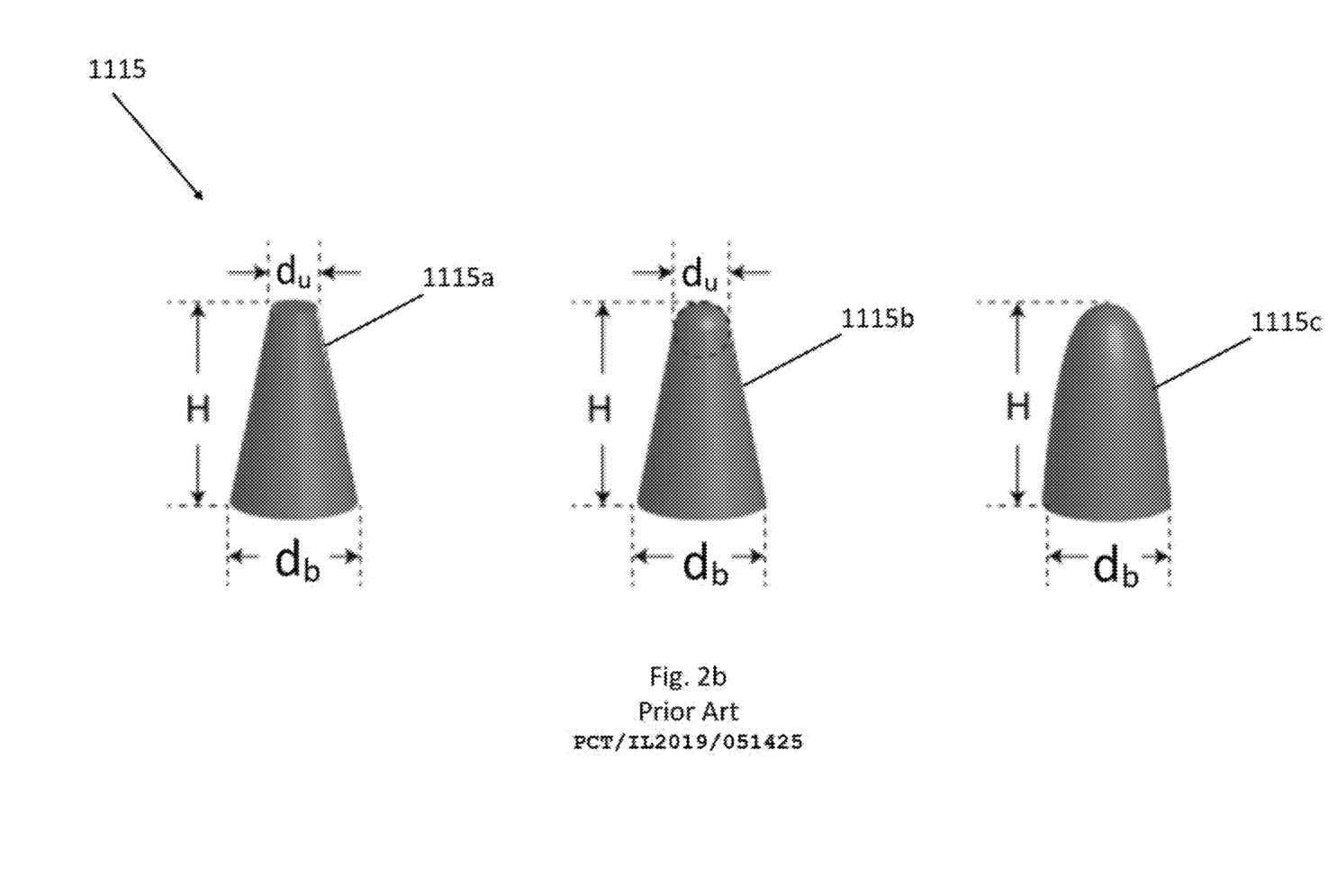
FIG. 2b shows various exemplary shapes for the unit-cells of PCT/IL2019/051425.

FIG. 2b shows various exemplary shapes for the gradually expanding elements 1115 of PCT/IL2019/051425: a truncated cone 1115a, a cone with a hemispherical tip 115b, and a parabolic cone 1115c. Other gradually expanding shapes, such as pyramids, can also be used on the facet of PCT/IL2019/051425.

The input and output facets of PCT/IL2019/051425 can be fabricated using a FIB (Focus Ion Beam) machine. Beginning with a smooth facet (as in the prior art device 1010 of FIG. 1), the FIB machine etches the facet based on a pre-programmed computer-aided design (CAD), removes material to produce a facet with a grid of protruding and gradually expanding elements. For example, a FIB machine, manufactured by Thermo Fisher Scientific, dual-beam G3, can create the input facets having the grids of the various elements shown FIG. 2b.

The facet structure of PCT/IL2019/051425 (shown in FIG. 2a minimizes the reflections from the input facet (and optionally also the signal reflections from the output facet—if structured accordingly), resulting in significantly higher efficiency compared to prior art waveguides. Furthermore, the waveguide of PCT/IL2019/051425 provides this improved transmission efficiency for a broadband light spectrum, in contrast to other prior art on-chip waveguides that provide relatively low reflections only for a single spectral line and a relatively low efficiency in the spectrum of operation.

PCT/IL2019/051425 demonstrated an average transmission efficiency through the waveguide as high as 98.13% in a wavelength range from 1 µm to 2 µm using cones with parabolic tips arranged in the staggered grid.

Figure 3A:
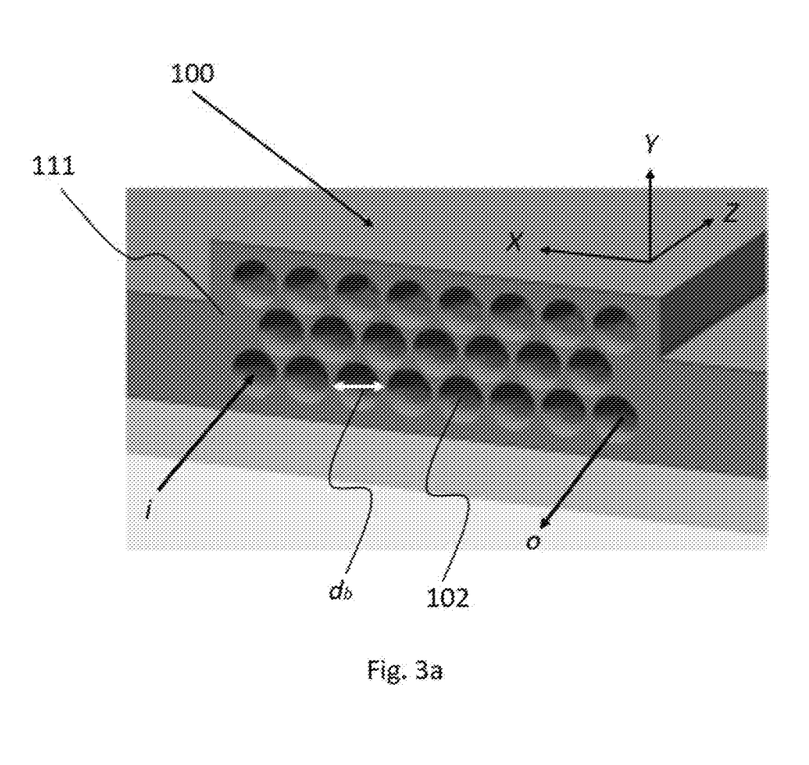
FIG. 3a shows a structure of an on-chip waveguide 100, according to an embodiment of the invention.

FIG. 3a shows a structure of an on-chip waveguide 100, according to an embodiment of the invention. The input and/or output facet 111 of waveguide 100 includes an array of recesses 102, each having sub-wavelength dimensions. Recesses 102 may be arranged, for example, in a grid-like arrangement or a staggered arrangement (shown in FIG. 3a). Each of the recesses defines a 3-dimensional hollow with a cross-section that narrows in a direction from the facet's external surface towards the waveguide's internal. More specifically, recess 102 has a cross-section shape of any of the protrusions discussed in PCT/IL2019/051425, for example, cone, pyramid, truncated cone (such as recess 102a shown in FIG. 3b), truncated pyramid, etc. Various gradually narrowing cross-section shapes may be used for the recesses, such as truncated, parabolic, hemispherical, etc. (cross-sections similar to those shown in FIG. 2b). The base diameter $D_b$ of each unit-cell 102 is between 460 nm and 580 nm. The depth H of each recessed unit cell is in the range between 800 nm and 950 nm. The waveguide's core material may be selected from silicon, germanium, silicon nitride, or another material commonly used for photonic integrated circuitry.

The sub-wavelength recesses 102 can be fabricated using a focused ion beam (FIB). The inventors of the present invention have demonstrated that a waveguide facet with gradually narrowing recesses (as in FIGS. 3a and 3b) performs similar to those of PCT/IL2019/051425 have gradually expanding protrusions on their facets. More specifically, the waveguide 100 having input and output facet structure with sub-wavelength unit-cells as in FIGS. 3a and 3b can act as a broadband component, having transmission efficiency in the order above 96%.

The present invention's recess array structure is simpler to fabricate than the protruding grid structure of PCT/IL2019/051425. The input and output facets of the waveguide 100 may be fabricated using a FIB (Focus Ion Beam) machine. Beginning with a smooth facet (as in the prior art waveguide 1010 of FIG. 1), the FIB machine etches the facet based on a pre-programmed computer-aided design (CAD) and removes material to create a facet with an array of gradually narrowing recesses (when viewed in a direction from the facet's surface inward to the waveguide's core). For example, a FIB machine, manufactured by Thermo Fisher Scientific, dual-beam G3, was used to create the input (and similarly the output) facet having array 111 of the elements shown in FIGS. 3a and 3b. Those facets were tested in the experiments described below. The fabrication of the invention's structure is simpler than the process for creating protrusions (such as those in FIGS. 2a and 2b) that in turn requires masking, deposition, etching, etc.

Figure 3B:
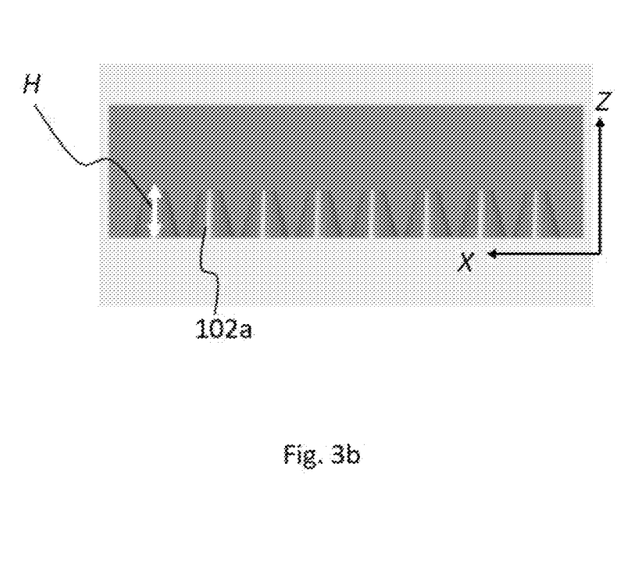
FIG. 3b shows a cross-section made along a longitudinal plane of a waveguide, showing the cross-section of one line from a facet's array of recesses, each recess having a shape of a truncated cone.

The facet structure of FIGS. 3a and 3b minimizes the reflections from the input facet (and optionally also the signal reflections from the output facet—if structured accordingly), resulting in much higher efficiency than prior art waveguides (excluding those of PCT/IL2019/051425). Furthermore, the invention's waveguide provides this improved transmission efficiency for a broadband light spectrum, in contrast to the prior art on-chip waveguides that provide relatively low reflections only for a single spectral line and a relatively low efficiency in the spectrum of operation.

FURTHER DISCUSSION AND EXPERIMENTS

PCT/IL2019/051425 discloses an anti-reflection (AR) surface with unit cells that protrude from the facet's surface. Although such a structure provides advantages over the prior art smooth waveguide's surface, its fabrication is complicated and challenging. To fabricate such a structure, one has to etch the area of the waveguide's facet leaving the protrusions.

To find a structure that requires a less-complicated fabrication process, the inventors applied Babinet's principle. According to Babinet's principle, the diffraction pattern from an opaque body is identical to the diffraction from a hole of the same size and shape, except for the overall forward beam intensity. Based on this principle, the inventors realized that the fabrication process could be facilitated by utilizing inverted features drilled into the waveguide. The "drilling" of the unit cells, each having a dimension of micro or nanometer scale, can be performed by utilizing techniques such as Focused Ion Beam (FIB).

The inventors explored the influence of a shape of a truncated cone unit-cell on the anti-reflection property of a waveguide by integrating the power flow in the z-direction (behind the structure) at a distance of 2.5 µm from the facet. The overall simulation size dictates the choice of this distance. The inventors further integrated the power inside the waveguide (i.e., the transmitted power), at four virtual planes at distances between 9 µm and 13 µm from the facet. The transmitted power was then averaged to eliminate noise. For shorter wavelengths, the unit-cell size may not be sub-wavelength in terms of the silicon's wavelength propagation. In these wavelengths, the structure experiences near-field effects due to diffraction. The inventors noticed that the waveguide's power is unstable for short wavelengths up to a distance of approximately 6 µm from the facet. For this reason, the transmitted power was calculated at a distance of 9 µm from the facet. The waveguide structure was terminated after 14 µm with an absorbing boundary condition (perfectly matched layer-PML) so that the simulated structure behaved as an infinite wave guide.

Figure 4A:
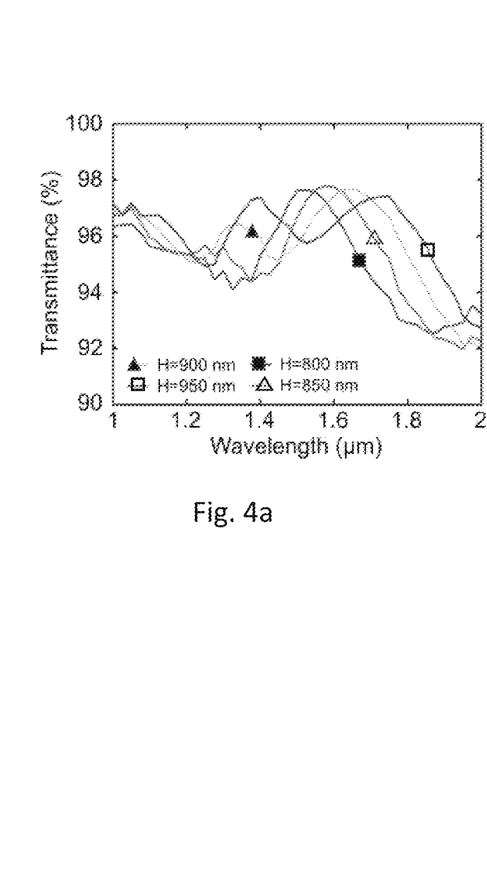
FIGS. 4a-4c show numerical-simulation results for recessed unit-cells.
Figure 4B:
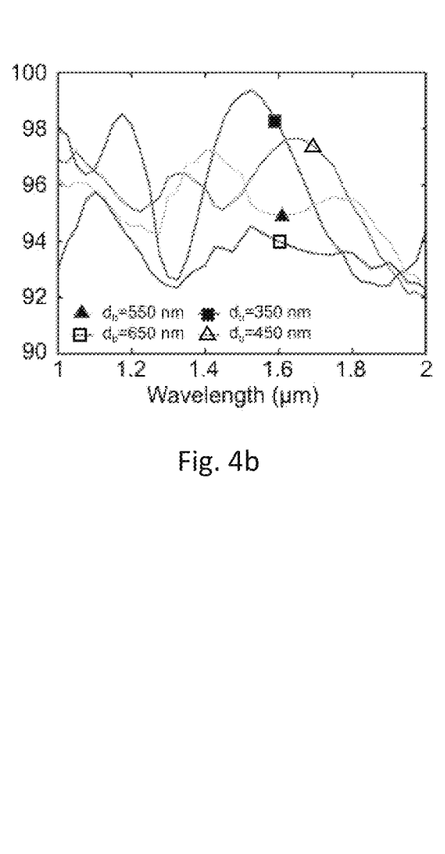
Figure 4C:
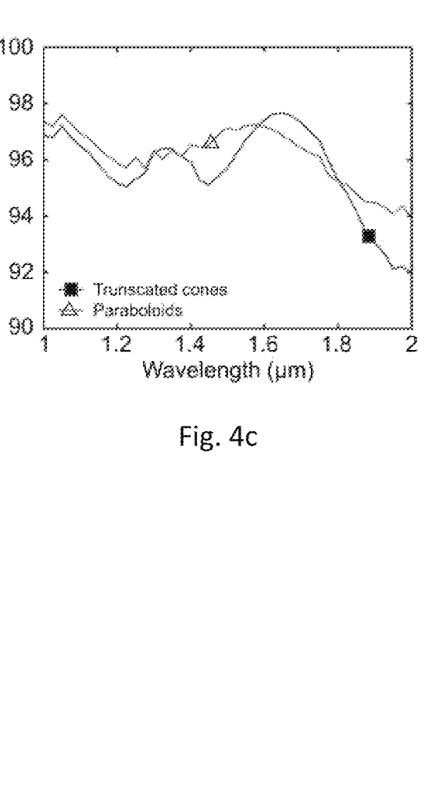

FIGS. 4a-4c show numerical-simulation results for recessed unit-cells. FIG. 4a shows the transmission as a function of wavelength for a hexagonal grid of inverted cones carved on a waveguide facet. The inverted-cone recesses had a base diameter of $d_b$=450 nm, an upper radius of $d_u$=200 nm, and a depth H varied from 800 nm to 950 nm in steps of 50 nm. FIG. 4b shows the transmission as a function of wavelength for a hexagonal grid depth of H=900 nm, an upper radius of $d_u$=200 nm. The base radius $d_b$ varied from 350 nm to 650 nm in steps of 100 nm. FIG. 4c shows the transmission as a function of wavelength for a hexagonal grid. The line marked by a filled square represents an array of truncated cones with a base radius of $d_b$=450 nm, a top radius of $d_u$=200 nm, and a depth of H=900 nm. The line marked by the empty triangle represents an array of paraboloids with a bottom radius of $d_b$=450 nm and a depth of H=900 nm.

Briefly, FIG. 4a shows a comparison of the transmittance as a function of wavelength. The diameter of each truncated cone was 450 nm, and the depth was varied from H=800 nm to H=950 nm with steps of 50 nm. The calculated results are very close to those obtained for the protruding unit-cells. The transmission drops for a longer wavelength since H becomes shorter in terms of the wavelength at these regions. The lower transmittance can be attributed to several factors, such as unit cell size and gradient index change in refractive index.

The unit-cells' size is not small enough for the shorter wavelengths regime due to the large refractive index of the waveguide core material (silicon in our case). Also, the effective refractive index is not continuous at the air-meta-surface interface and at the meta-surface-waveguide core interface since the filling factor with cones structures cannot reach 100% with round features. Next, the inventors compared the effect of the unit-cell size in FIG. 4b. The cones' depth was considered a constant value of 900 nm, and the base diameters varied for values of $d_b$=350 nm, 450 nm, 550 nm, and 650 nm. The shorter wavelengths region shows higher transmission as the structure approaches the sub-wavelength regime. However, the results for $d_b$=350 nm also exhibit a stronger resonant behavior due to the increase in the effective index at the interfaces. Even though a unit-cell size of $d_b$=350 nm can increase the transmission up to 99.4%, one can achieve transmission above 95% over a spectral range of 1.0-1.8 μm by increasing the unit-cell up to $d_b$=450 nm. The inventors also compared the facet with truncated cone recesses with a diameter of $d_b$=450 nm and height of H=900 nm to paraboloids with the same depth and base diameter. FIG. 4c shows the result of this comparison. It can be noted that the anti-reflective structure of a facet made of paraboloids exhibits less resonant behavior due to the continuity of the effective index at the tip of the meta-surface. With an array of parabolic recesses, a transmission of more than 94% can be achieved over an entire spectral range of 1-2 μm.

While some embodiments of the invention have been described by way of illustration, it will be apparent that the invention can be carried into practice with many modifications, variations, and adaptations, and with the use of numerous equivalent or alternative solutions that are within the scope of persons skilled in the art, without departing from the spirit of the invention or exceeding the scope of the claims.

The invention claimed is:

1. A unitary on-chip passive optical waveguide comprising an input or output facet, the facet comprising an array of sub-wavelength size unit-cells, each unit cell is a recess that gradually narrows in the direction from the outer of the waveguide towards the interior of the waveguide, wherein the waveguide's core and each of the recessed unit cells are made of a material selected from silicon, gallium-arsenide or silicon-nitride having a refractive index higher than 2.0 and a structure selected from the group comprising cones, truncated cones, hemispherical cones, or parabolic cones.

2. The on-chip waveguide of claim 1, wherein the unit-cell recesses are arranged on the facet in a staggered form.

3. The on-chip waveguide of claim 1, wherein the unit-cells are arranged on the facet in a linear array form.

4. The on-chip waveguide of claim 1, wherein each unit-cell has a diameter between 460 nm and 580 nm and a depth between 800 nm and 950 nm.

5. A chip comprising one or more unitary on-chip passive optical waveguide, wherein each unitary on-chip optical waveguide is configured according to claim 1.

6. The chip of claim 5, wherein the chip comprises between 10 and 200 unitary on-chip passive optical waveguides.

7. The chip of claim 5, wherein the chip comprises at least 100 unitary on-chip passive optical waveguides.

* * * * *